May 17, 1966 R. W. HATCH, JR 3,251,547
FLUID LOGIC DIFFUSION UNIT RING COUNTER
Filed June 24, 1964 2 Sheets-Sheet 1
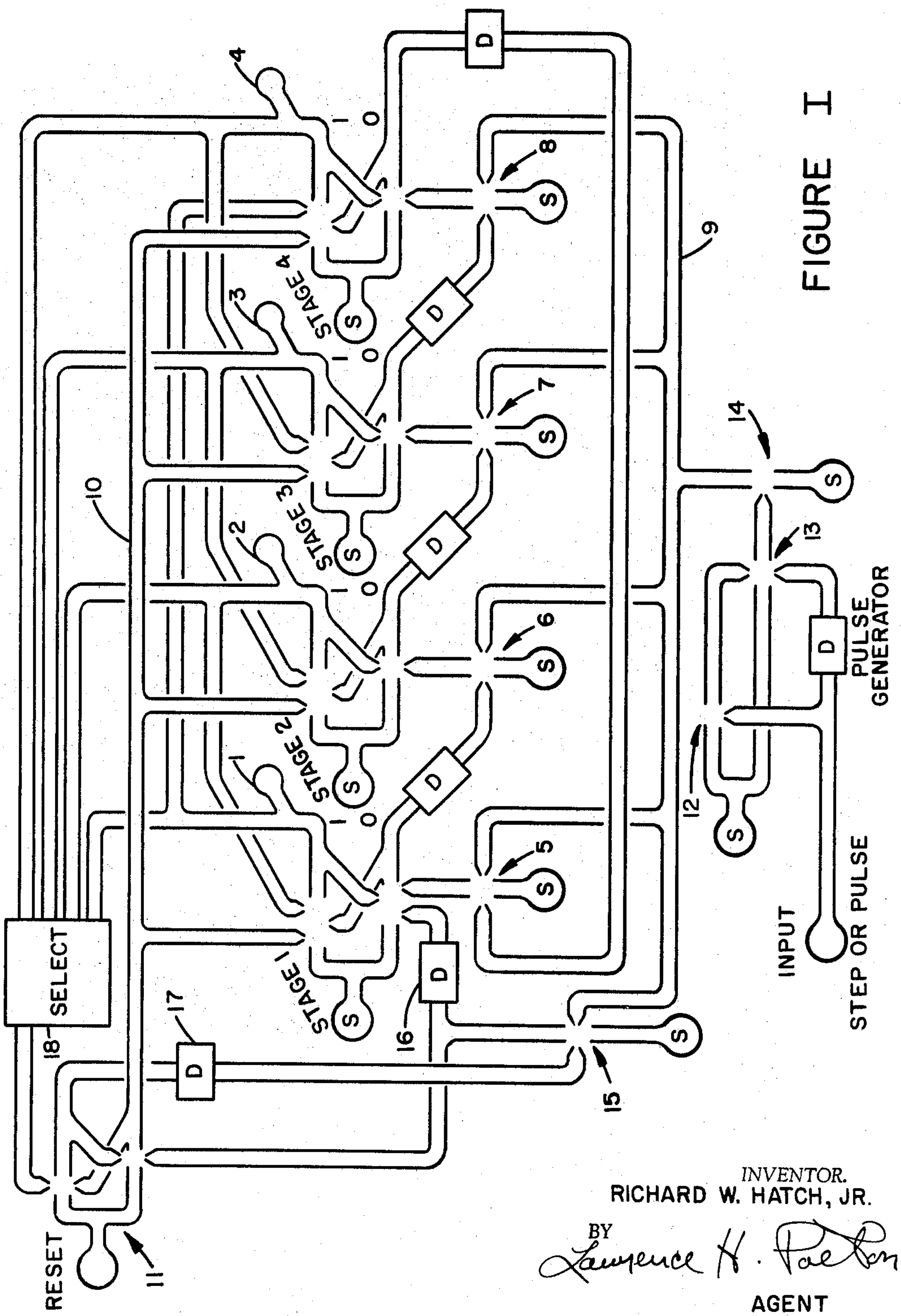
FIGURE I
INVENTOR.
RICHARD W. HATCH, JR.
BY Lawrence H. Patton
AGENT

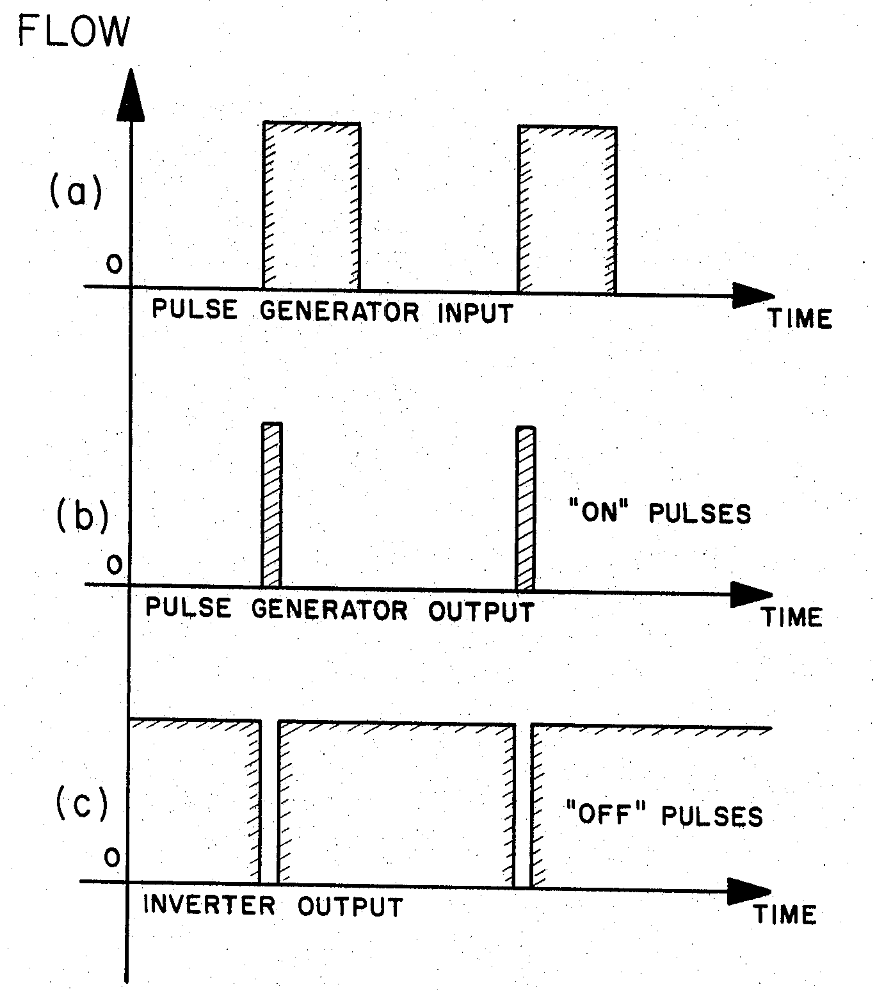
FIGURE II
INVENTOR.
RICHARD W. HATCH, JR.
BY Laurence H. Patton
AGENT

United States Patent Office 3,251,547
Patented May 17, 1966

3,251,547

FLUID LOGIC DIFFUSION UNIT RING COUNTER

Richard W. Hatch, Jr., Norwell, Mass., assignor to The Foxboro Company, Foxboro, Mass., a corporation of Massachusetts Filed June 24, 1964, Ser. No. 377,754
1 Claim. (Cl. 235—201)

This invention relates to counting devices and particularly provides a ring counter made up entirely of fluid logic diffusion units and operated on a dynamic fluid flow basis.

Ring counters by this invention are now provided in the useful field of the fluid logic with no moving parts and specifically with respect to this invention with all of the fluid logic units of the same nature, that is diffusion units, wherein a simple flow from an outlet to an inlet is allowed to pass or not to pass. In the "not pass" situation the flow is diffused to atmosphere, or other suitable ambient sink, by the application of a lateral control signal thereto. This simple diffusion unit is extremely useful and easy to set up in the use of its units. Thus the entirety of this device provides a new and useful uniformity of operation in a fluid logic ring counter device.

Each of the diffusion units is provided with a flow or power source indicated at S. The flow through each unit may be shut off by the application of a lateral signal from either side.

It is therefore an object of this invention to provide a new and useful fluid logic ring counter device based on a uniform and exclusive use of fluid logic diffusion units.

Other objects and advantages of this invention will be in part apparent and in part pointed out hereinafter and in the accompanying drawings, wherein:

FIGURE I is a schematic illustration of a diffusion unit fluid logic ring counter according to this invention; and FIGURE II is the pulse chart illustrating the application of pulse signals to the device of this invention.

The ring counter shown in FIGURE I has, as an illustrative example, four stages. It can be built up of any desired number of stages. The ring counter responds to pulses at its input, giving an "on" signal in one of its outputs as at $O_1$, $O_2$, etc. This "on" signal moves from one output to the succeeding one in response to each pulse at the input. The pulse generator following the input enables the ring counter to respond to steps or extended pulses as well as short pulses, its function being to convert a step to a short pulse. In the ring counter shown, all functions are performed by turbulence amplifiers.

*Pulse generator*

Consider the response of the pulse generator to an upgoing step. Initially, the input is "off," and it has been in this condition for sufficient time that an "off" signal is being fed to both of amplifiers 12 and 13. This "off" signal turns amplifier 12 "on." This in turn shuts amplifier 13 "off" and there is no output from the pulse generator. When the upgoing step appears, this immediately feeds an "on" signal to amplifier 12, shutting it "off" and supplying an "off" signal to amplifier 13, turning it "on." This occurs because the second input to amplifier 13 remains "off" due to the time delay "D." Thus, temporarily, an "on" signal is provided from the pulse generator output. After a brief interval, the input signal overcomes the time delay, shutting amplifier 13 "off" and restoring the pulse generator output to its original "off" condition. As shown in FIGURE II, a brief output pulse, the duration of which is determined by the time delay "D," is obtained for each upgoing step.

Tracing through the operation of the device in response to a down-going step will show that no pulse is produced. The generator responds only to upgoing fronts and will therefore give only one short pulse to each extended pulse supplied to its input.

*Flip-flop action*

Each flip-flop function consists of two turbulence devices cross-connected as shown. As an example stage 1 initially may be in the "0" condition, that is, the "0" side is turned on, and the "1" side is turned off. A pulse applied to one of the "0" side inputs will turn that side off, supplying an "off" signal through the cross-connection to the "1" side amplifier, turning it on. This in turn supplies an "on" signal to the "0" side amplifier, insuring that it remains "off" even when the initiating pulse is removed.

Likewise, the flip-flop function can be restored to the "on" condition by supplying a pulse or an "on" signal to any of the "1" side inputs.

*Operating sequence*

The "on" pulses from the pulse generator are fed through an inverter amplifier 14 so that "off" pulses, as shown in FIGURE II(*c*), are obtained in the signal manifold 9. These "off" pulses supplied to the gate inverters 5, 6, 7 and 8 produce "on" pulses which are fed directly to one of the flip-flops whenever the gate corresponding to that particular flip-flop is enabled. This enabling condition exists whenever an "off" signal is being supplied to the other input, the gating input, of the gate inverter.

During the operation, only one of the flip-flops is in the "1" condition at any one time, all the others are in the "0" condition. When a flip-flop is in the "1" condition, it does two things: (1) it enables the gate of the following flip-flop by supplying an "off" signal through a forward connection from its "0" output; (2) and it resets the preceding stage by supplying an "on" signal from its "1" output through a back connection to the "1" side input of the preceding stage. The fact that the succeeding stage gate is enabled means that the next input pulse to arrive will trigger only the succeeding stage to the "1" condition, all others being unaffected. Then that stage, in transferring to the "1" condition, resets the preceding stage. The fact that this transfer depends on the preceding stage being in the "1" condition in order to enable the gate, means that the resetting action must be delayed. This occurs provided there is a time delay in either the back connection to the preceding flip-flop, or the forward connection to the succeeding gate. These delays, which are normally inherent in the piping, are shown in FIGURE I in the forward connections.

Initially, assume that all four stages in FIGURE I are in the "0" condition. This condition is produced by an "on" signal, a reset signal, in the reset manifold 10 which, supplied to the "1" side of all the flip-flops, restores them to the "0" condition. The reset signal, in turn, is obtained when the reset flip-flop 11 is in the "0" condition. When it is in this initial "0" condition, the reset flip-flop, in addition to supplying a reset signal to the counter, also supplies an "off" signal from its "1" side output to the auxiliary gate 15, enabling it.

Consider now a pulse arriving at the input inverter 14. Since all four counter stages are in the "0" state, all four gates 5, 6, 7 and 8 will be closed. However, auxiliary gate 15 is open and the pulse is fed to stage 1 transferring it to the "1" condition. Since this transfer in turn opens gate 6 to the second stage, it is necessary that there be sufficient time delay in the forward connection, as previously discussed. In addition, if the transition of stage 1 to the "1" state is to occur at all, it is necessary that the reset signal applied to the "1" side of the stage 1 flip-flop has been removed previously. This is insured by the delay 16 in the auxiliary input to the first stage which means that the transition of reset flip-flop 11 occurs before that of the stage 1 flip-flop. Since the gate 15 must remain open throughout, an additional delay 17 is inserted to prevent the gate closing prematurely.

Thus, the first pulse transfer stage 1 to the "1" condition and transfers the reset counter to the "1" condition, thereby closing the gate 15 and opening the gate 6 to the succeeding stage. Gate 15 will then remain closed until the hole counter is reset, that is, until the pulse fed through the selector switch from one of the outputs restores the reset flip-flop to the reset or "0" condition.

The second input pulse to appear, at the input inverter 14, is fed through gate 6, the only gate that is open, to the second stage flip-flop, transferring it to the "1" stage and thereby resetting the preceding stage 1 flip-flop and enabling the following stage 3 gate, 7. In this way, the "1" condition travels down the counter, stage by stage, until the reset point, determined by the setting of the selector switch 18, is reached. In FIGURE I, the selector switch is set to reset the counter at stage 3. When stage 3 switches to the "1" condition, the "on" signal, fed through the switch, transfers the reset flip-flop to the "0" condition resetting the ring counter, opening the gate 15, and restoring the whole counter to its initial condition.

The whole cycle is then repeated with succeeding pulses.

This invention therefore provides a new and useful fluid logic ring counter.

As many embodiments may be made of the above invention, and as changes may be made in the embodiments set forth above without departing from the scope of the invention, it is to be understood that all matter hereinbefore set forth or shown in the accompanying drawings is to be interpreted as illustrative only and not in a limiting sense.

I claim:

A fluid logic ring counter of the travelling signal type and formed entirely of operatively interconnected fluid logic diffusion units, said counter comprising, in combination, a series of fluid logic diffusion flip-flop units, each of said units forming the nucleus of one stage of said ring counter, each of said flip-flop units comprising a single, continuous flow fluid source input, a pair of outputs branched from said source, a transverse control opening in each of said outputs, and a cross-over control passage from each of said outputs to the control opening of the other of said outputs, an individual continuous flow fluid source input for each of said stages, with a gating control passage therefrom directed to the transverse control opening of one of said outputs of the flip-flop unit of its related stage, each of said gating control passages having a transverse control opening therein, a signal input continuous flow fluid source, a signal input single passage therefrom, a transverse control opening in said signal input passage, a signal input manifold branching from said signal input passage, an output passage extending from said manifold to each of said control openings of said gating control passages as means for applying control signals thereto, a pulse input system for controlling said signal input, said pulse system comprising a fluid diffusion unit having a continuous flow fluid source, a pulse control input from said source, a pair of pulse control outputs from said pulse control input, each of said pulse control outputs having a transverse control opening therein, with one of said pulse control outputs directed to the transverse control opening of the other of said pulse control outputs, said other of said pulse control outputs being directed to the transverse control opening in said input signal passage, a signal pulse input system comprising an input passage with one signal pulse output branch directed to the transverse control opening of said one of said pulse control outputs, another signal pulse output branch directed to the transverse control opening of said other of said pulse control outputs, and delay means in said other signal pulse control output branch, a reset system comprising a fluid logic diffusion flip-flop unit having a single, continuous flow fluid source input, a pair of reset outputs branched from said reset source, a transverse control opening in each of said reset outputs, and a cross-over control passage from each of said reset outputs to the transverse control opening of the other of said reset outputs, a reset manifold to which one of said reset outputs is applied, with an output passage extending from said reset manifold to each stage of said counter to the transverse control openings of one output of each of said stage nucleus fluid logic diffusion flip-flop units, an auxiliary gate system comprising a single continuous flow fluid source auxiliary gate input, a transverse control opening in said auxiliary gate input, one auxiliary gate control passage from said signal input manifold to said auxiliary transverse control opening, another auxiliary gate control passage from said reset system to said auxiliary transverse control opening, specifically from the reset output other than that leading to the reset manifold, and delay means in said other auxiliary gate control passage, means for auxiliary control of said reset system and of the first stage of said counter, comprising a branch passage from said auxiliary gate input to said reset system to the transverse control opening in the reset output which leads to the reset manifold, a branch passage from said auxiliary gate input to the flip-flop unit in said first stage of said counter to the transverse control opening of the flip-flop output of said first stage which is other than the output to which said reset manifold is applied, and delay means in said last named auxiliary gate branch passage, a reset select system comprising a select unit, manifold take-off passages from each of the diffusion flip-flops in the counter stages to said select unit, specifically from the same flip-flop outputs to which the reset manifold passages are applied, and a single reset select output control passage from said select unit to said reset system, specifically to the transverse control opening of the reset output other than that leading to the reset manifold.

a feedback reset system comprising a passage from each stage of the counter back to the next previous stage, specifically from each of said select system take-off passages to the transverse control openings of the same flip-flop outputs to which the reset manifold passages are applied, a feedforward enabling system comprising a passage from each stage of the counter to the next succeeding stage, specifically from the flip-flop outputs in each stage to which gating control passages are applied, to the transverse control opening of the gating control passage of the next succeeding stage, and delay means in each of said feedforward, enabling passages, and, readout means for said counter comprising a readout passage branching from each of said reset selec take-off passages.

References Cited by the Examiner

UNITED STATES PATENTS

| | | | |
|---|---|---|---|
| 3,190,554 | 6/1965 | Gehring et al. | 235—20 |
| 3,193,197 | 7/1965 | Bauer | 235—20 |

FOREIGN PATENTS

| | | |
|---|---|---|
| 1,361,162 | 4/1964 | France. |
| 563,579 | 11/1932 | Germany. |

OTHER REFERENCES

Strong: "The Amateur Scientist," Scientific American, vol. 207, No. 2, August 1962, pages 128–138.

Norwood: "Generating Timed Pneumatic Pulses," IBM Technical Bulletin Disclosure.

LOUIS J. CAPOZI, *Primary Examiner.*

LEO SMILOW, *Examiner.*

W. F. BAUER, *Assistant Examiner.*